United States Patent
Ho et al.

(10) Patent No.: US 10,290,535 B1
(45) Date of Patent: May 14, 2019

(54) INTEGRATED CIRCUIT FABRICATION WITH A PASSIVATION AGENT

(71) Applicant: Taiwan Semiconductor Manufacturing Co., Ltd., Hsinchu (TW)

(72) Inventors: Chun-Te Ho, Hsinchu (TW); Shih-Yu Chang, Hsinchu (TW); Da-Wei Lin, Hsinchu (TW); Chien-Chih Chiu, Tainan County (TW); Ming-Chung Liang, Hsin-chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/928,896

(22) Filed: Mar. 22, 2018

(51) Int. Cl.
*H01L 21/768* (2006.01)
*H01L 21/321* (2006.01)
*H01L 21/311* (2006.01)

(52) U.S. Cl.
CPC .. *H01L 21/76802* (2013.01); *H01L 21/31144* (2013.01); *H01L 21/3212* (2013.01); *H01L 21/7684* (2013.01); *H01L 21/76835* (2013.01); *H01L 21/76877* (2013.01)

(58) Field of Classification Search
CPC combination set(s) only.
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2004/0110369 A1* | 6/2004 | Jiang | H01L 21/76802 438/637 |
| 2009/0081864 A1* | 3/2009 | Matz | H01L 21/3148 438/637 |
| 2010/0136781 A1* | 6/2010 | Kulkarni | H01L 21/76807 438/622 |
| 2016/0247695 A1* | 8/2016 | Niskanen | H01L 21/02337 |

* cited by examiner

*Primary Examiner* — Mamadou Diallo
(74) *Attorney, Agent, or Firm* — Haynes and Boone, LLP (57) ABSTRACT

Examples of fabricating an integrated circuit device are disclosed herein. In an embodiment, an integrated circuit workpiece is received that includes a conductive interconnect feature. A first Inter-Level Dielectric (ILD) layer is formed on the conductive interconnect feature, and a second ILD layer is formed on the first ILD layer. A hard mask is formed on the second ILD layer. A via recess is etched extending through the first ILD layer, the second ILD layer and the hard mask to expose the conductive interconnect feature. The etching includes providing a passivation agent that reacts with a material of the hard mask to reduce etchant sensitivity.

20 Claims, 12 Drawing Sheets

INTEGRATED CIRCUIT FABRICATION WITH A PASSIVATION AGENT

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

Advances have been made to device fabrication as well as to the fabrication of the network of conductors that couple them. In that regard, an integrated circuit may include an interconnect structure to electrically couple the circuit devices (e.g., Fin-like Field Effect Transistors (FinFETs), planar FETs, Bipolar-Junction Transistors (BJTs), Light-Emitting Diodes (LEDs), memory devices, other active and/or passive devices, etc.). The interconnect structure may include any number of dielectric layers stacked vertically with conductive lines running horizontally within the layers. Vias may extend vertically to connect conductive lines in one layer with conductive lines in an adjacent layer. Similarly, contacts may extend vertically between the conductive lines and substrate-level features. Together, the lines, vias, and contacts carry signals, power, and ground between the devices and allow them to operate as a circuit.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-11 are cross-sectional view diagrams of a portion of a workpiece undergoing a method of forming according to some embodiments of the present disclosure.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

As feature sizes shrink, the final size of an integrated circuit may depend as much on the interconnect structure as on the circuit devices. However, the interconnect has generally resisted efforts to shrink it. While the thickness of the conductive lines within the interconnect may be reduced and the lines may be packed more tightly, such configurations have proven challenging to reliably fabricate. For example, reducing line size and spacing may increase the incidence of bridging, necking, discontinuities, and other defects.

Some of these challenges arise from minor alignment issues (i.e., overlay) between the masks used to form semiconductor features, lines, vias, and contacts. As the spacing between features is reduced, the acceptable margin of overlay error becomes smaller as well. Even when overlay errors are not significant enough to cause shorts between adjacent features, if the overlay error thins the intervening dielectric enough, a leakage path may develop. In that regard, leakage may occur even between features that do not physically contact.

As described below, the present disclosure provides a technique for forming conductive lines and vias that, in some examples, increases the acceptable margin of overlay error (an aspect of the process window). This may reduce defects and increase yield even when overlay error remains the same. In some examples, a hard mask is formed on layers of an inter-level dielectric of the interconnect structure and is used when etching the dielectric to create recesses for the conductive features. The etching technique utilizes an etchant and/or an ambient atmosphere configured to passivate the hard mask. In this way, inadvertent etching of the hard mask is reduced and more precise recesses are formed in the dielectric. This increased precision may reduce the adverse effects of overlay errors such as leakage current between features. However, unless otherwise noted, no embodiment is required to provide any particular advantage.

Figure 1A:
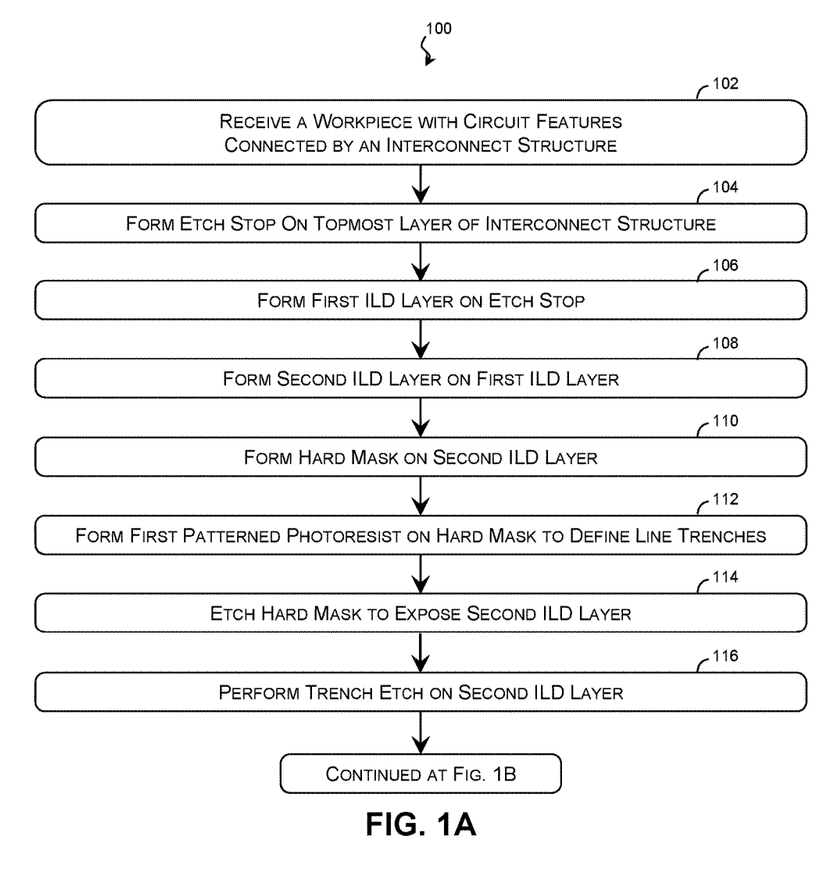
FIGS. 1A and 1B are flow diagrams of a method of forming a workpiece with an interconnect structure according to some embodiments of the present disclosure.
Figure 1B:
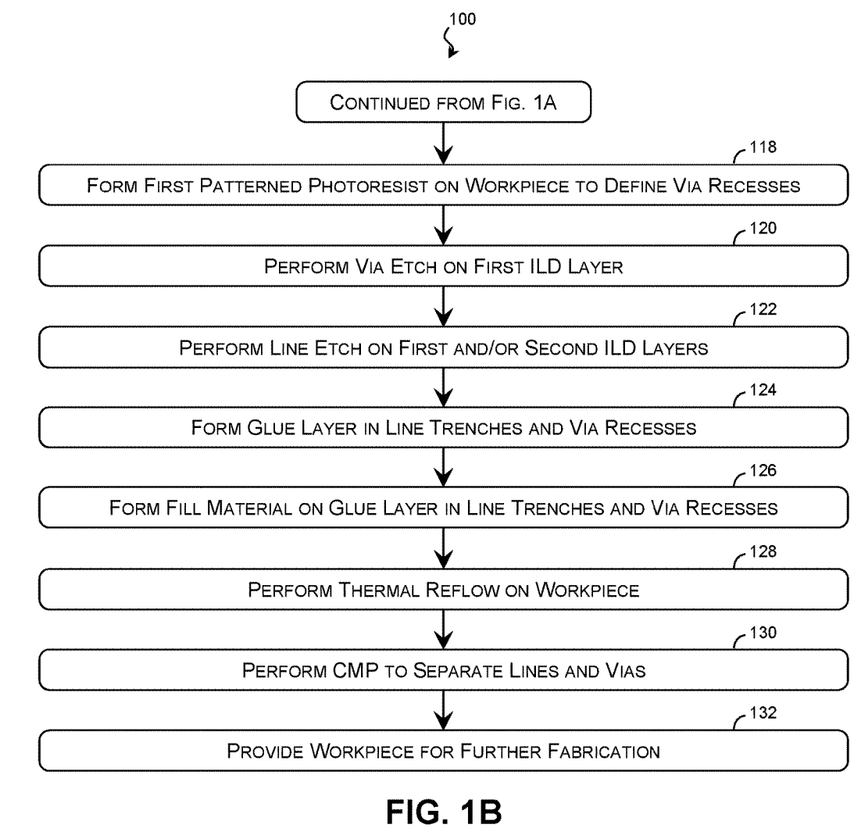

Some examples of a technique for forming an interconnect structure on a workpiece are described with reference to FIGS. 1A-11. FIGS. 1A and 1B are flow diagrams of a method 100 of forming a workpiece with an interconnect structure according to some embodiments of the present disclosure. Additional steps can be provided before, during, and after the method 100, and some of the steps described can be replaced or eliminated for other embodiments of the method 100. FIGS. 2-11 are cross-sectional view diagrams of a portion of the workpiece 200 undergoing the method 100 of forming according to some embodiments of the present disclosure.

Figure 2:
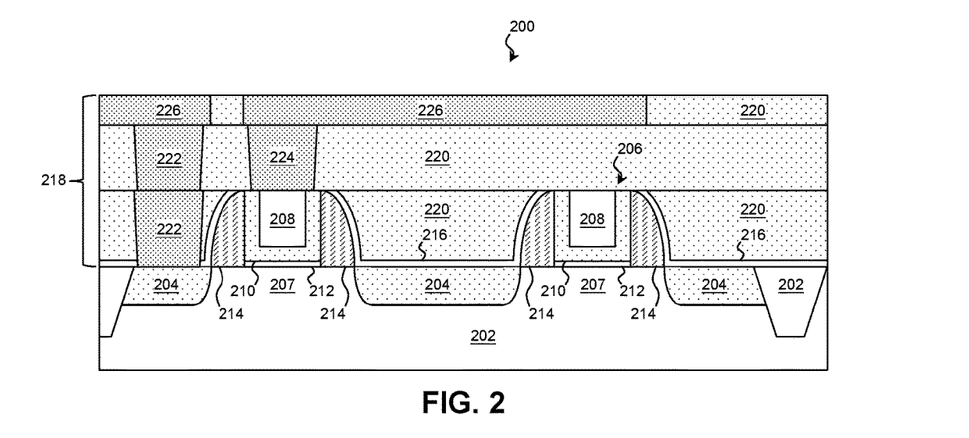

Referring to block 102 of FIG. 1A and to FIG. 2, a workpiece 200 is received that includes a substrate 202 with one or more integrated circuit features formed upon it that are connected by an interconnect structure. In various examples, the substrate 202 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 202 may be uniform in composition or may include various layers. The layers may have similar or different compositions, and in various embodiments, some substrate layers have non-uniform compositions to induce device strain and thereby tune device performance. An example of a layered substrate includes a silicon-on-insulator (SOI) substrate 202. In some such examples, a layer of the substrate 202 may include an insulator such as a semiconductor oxide, a semiconductor nitride, a semiconductor oxynitride, a semiconductor carbide, and/or other suitable insulator materials.

Various circuit features may be formed in and on the substrate 202. These circuit features may form Field Effect Transistors (FETs), Metal-Oxide Semiconductor Field Effect Transistors (MOSFETs), Complementary Metal-Oxide Semiconductor (CMOS) transistors, FinFETs, high voltage transistors, high frequency transistors, bipolar junction transistors, diodes, resistors, capacitors, inductors, varactors, other suitable devices, and/or combinations thereof.

In an exemplary embodiment, the workpiece includes a FET that, in turn, includes doped regions such as source/drain regions 204. The source/drain regions 204 may be doped with p-type dopants (P+) (such as boron or $BF_2$) or n-type dopants (N+) (such as phosphorus or arsenic) based on the carrier type of the FET. The source/drain regions 204 may be disposed in the substrate 202 in an example of a planar circuit device or may extend out of the substrate 202 in an example of a non-planar circuit device (e.g., a FinFET).

The FET may also include a gate stack 206 disposed on the substrate 202 between the source/drain regions 204 to define a channel region 207 therebetween. The flow of carriers (electrons for an n-channel device and holes for a p-channel device) through the channel region between the source/drain regions 204 is controlled by a voltage applied to the gate stack 206. At a high level, the gate stack 206 includes a conductive electrode 208 disposed over the channel region 207 and separated by a gate dielectric 210.

Exemplary gate electrodes 208 include polysilicon as well as metal-containing gate electrodes 208. In various examples, a metal-containing gate electrode 208 includes a capping layer disposed on the gate dielectric 210, a barrier layer disposed on the capping layer, one or more work-function layers disposed on the barrier layer, and an electrode fill disposed on the barrier layer. In some such examples, the capping layer includes TaSiN, TaN, and/or TiN; the barrier layer includes W, Ti, TiN, and/or Ru; the work-function layers include TiN, TaN, Ru, Mo, Al, WN, $ZrSi_2$, $MoSi_2$, $TaSi_2$, $NiSi_2$, and/or WN for a p-channel device or Ti, Ag, TaAl, TaAlC, TiAlN, TaC, TaCN, TaSiN, Mn, and/or Zr for an n-channel device; and the electrode fill includes W, Al, Ta, Ti, Ni, Cu, and/or Co.

Exemplary gate dielectrics 210 include high-k dielectrics as well as semiconductor oxides, semiconductor nitrides, and/or semiconductor oxynitrides. In that regard, the gate dielectric 210 may be characterized by its dielectric constant relative to silicon dioxide. A high-k-type gate dielectric 210 may include a metal oxide (e.g., LaO, AlO, ZrO, TiO, $Ta_2O_5$, $Y_2O_3$, $SrTiO_3$ (STO), $BaTiO_3$ (BTO), BaZrO, HfZrO, HfLaO, HfTaO, HfTiO, $(Ba,Sr)TiO_3$ (BST), $Al_2O_3$, etc.), a metal silicate (e.g., HfSiO, LaSiO, AlSiO, etc.), a metal or semiconductor nitride, a metal or semiconductor oxynitride, combinations thereof, and/or other suitable materials. To promote adhesion with the substrate 202 and to prevent interface defects, the gate stack 206 may include an interfacial layer 212 disposed between the gate dielectric 210 and the substrate 202. In some examples, the interfacial layer 212 includes an oxide or a nitride of a semiconductor present in the substrate 202.

In some examples, sidewall spacers 214 are formed on one or more lateral surfaces of the gate stack 206. The sidewall spacers 214 may include one or more layers of dielectric material (e.g., a semiconductor oxide, a semiconductor nitride, a semiconductor oxynitride, a semiconductor carbide, etc.). A contact-etch stop layer (CESL) 216 may be formed on the sidewall spacers 214 and extend over the source/drain regions 204. The CESL 216 may include a dielectric (e.g., a semiconductor oxide, a semiconductor nitride, a semiconductor oxynitride, a semiconductor carbide, etc.) or other suitable material, and in various embodiments, the CESL 216 includes SiN, SiO, and/or SiON.

The workpiece 200 includes an interconnect structure 218 to electrically couple the circuit features, such as the source/drain regions 204 and the gate stacks 206. The interconnect structure 218 includes a number of conductive features interspersed between layers of an Inter-Level Dielectric (ILD) 220. The ILD 220 may comprise any suitable dielectric material, such as a semiconductor oxide, a semiconductor nitride, TEOS oxide, a low dielectric constant material (relative to silicon dioxide and known as a low-k dielectric), and combinations thereof. Example low-k dielectric materials include PhosphoSilicate Glass (PSG), BoroPhosphoSilicate Glass (BPSG), Fluorinated Silica Glass (FSG), carbon doped silicon oxide, Black Diamond®, Xerogel, Aerogel, amorphous fluorinated carbon, Parylene, BCB (bis-benzocyclobutenes), SiLK® (a registered trademark of Dow Chemical, Midland, Mich.), polyimide, other suitable materials, and/or combinations thereof. The ILD 220 layers act to support and electrically isolate the conductive features.

The lowest layers of the interconnect structure 218 may surround the gate stacks 206 and may include contacts, such as Source/Drain (S/D) contacts 222 and gate contacts 224 disposed within the ILD 220. These contacts 222 and 224 may include one or more layers of conductive materials including metals (e.g., Ti, Ta, W, Al, Ni, Cu, Co, etc.), metal nitrides, metal oxides, metal carbides, and/or other suitable materials. In an example, a contact includes a glue layer of Ti and TiN on the outermost surface with a fill layer of W, Cu, or Al disposed within the glue layer. The contacts 222 and 224 may also electrically and physically couple to features of higher levels of the interconnect structure 218 such as the conductive lines 226. Similar to the contacts 222 and 224, the conductive lines 226 may include one or more metal-containing layers such as a glue layer of Ti and TiN and a fill layer of Cu, W, or Al.

Figure 3:
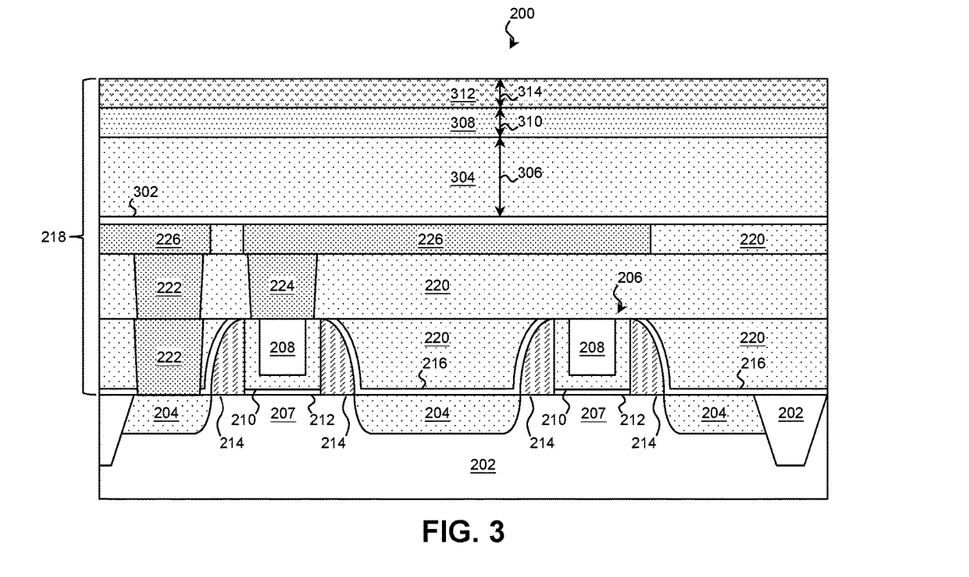

To form an additional layer of the interconnect structure 218, an etch stop 302 may be formed on the topmost existing layer of the interconnect structure 218 as shown in block 104 of FIG. 1A and FIG. 3. The etch stop 302 may include any number of layers, each containing any suitable material such as a dielectric (e.g., a semiconductor oxide, a semiconductor nitride, a semiconductor oxynitride, a semiconductor carbide, etc.), a metal, a metal oxide, a metal nitride, a metal carbide, and/or other suitable materials. The etch stop material(s) may be selected based on their resistance to an etchant, and in various examples, the etch stop 302 includes an aluminum nitride layer, an aluminum oxide layer, a silicon nitride layer, a silicon oxynitride layer, a silicon carbide layer, and/or a titanium nitride layer. The etch stop 302 may be formed by any suitable deposition technique including Chemical Vapor Deposition (CVD), Low-Pressure CVD (LPCVD), Plasma-Enhanced CVD (PECVD), Physical Vapor Deposition (PVD), Atomic Layer Deposition (ALD), spin-on coating, and/or other suitable techniques.

Referring to block 106 of FIG. 1A and referring still to FIG. 3, a first ILD layer 304 is formed on the etch stop 302. The first ILD layer 304 may include a semiconductor oxide, a semiconductor nitride, TEOS oxide, a low-k material, and/or other suitable material. The first ILD layer 304 may be formed by any suitable process including CVD, LPCVD, PECVD, PVD, ALD, spin-on coating, and/or other suitable techniques, and may be formed to any suitable thickness. In various examples, the first ILD layer 304 includes a low-k material and is formed by spin-on deposition. In some such examples, the first ILD layer 304 has a substantially uniform thickness 306 selected to be between about 300 Angstroms and about 1500 Angstroms.

Referring to block 108 of FIG. 1A and referring still to FIG. 3, a second ILD layer 308 is formed on the first ILD layer 304. The second ILD layer 308 may include a semiconductor oxide, a semiconductor nitride, TEOS oxide, a low dielectric constant (low-k) material, and/or other suitable material and may be different in composition from the first ILD layer 304. In that regard, a material of the second ILD layer may be selected to have a different etchant selectivity than the first ILD layer 304. The second ILD layer 308 may be formed by any suitable process including CVD, LPCVD, PECVD, PVD, ALD, spin-on coating, and/or other suitable techniques, and may be formed to any suitable thickness. In various examples, the second ILD layer 308 includes a semiconductor oxide (e.g., silicon dioxide) and is formed by CVD. In some such examples, the second ILD layer 308 has a substantially uniform thickness 310 selected to be between about 100 Angstroms and about 500 Angstroms.

Referring to block 110 of FIG. 1A and referring still to FIG. 3, a hard mask 312 is formed on the second ILD layer 308. The hard mask 312 may include a number of layers, each of which may include a metal, a metal compound (e.g., a metal oxide, a metal nitride, a metal carbide, etc.), a dielectric (e.g., a semiconductor oxide, a semiconductor nitride, a semiconductor carbide, etc.), and/or other suitable material. The material(s) of the hard mask 312 may be selected to have different etchant sensitivity than that of the first ILD layer 304 and the second ILD layer 308. The hard mask 312 may be formed by any suitable process including CVD, LPCVD, PECVD, PVD, ALD, spin-on coating, and/or other suitable techniques, and may be formed to any suitable thickness. In an example, the hard mask 312 includes TiN and is formed by CVD and/or PVD. In further examples, the hard mask 312 includes a nitride (e.g., TaN, SiN, WN, etc.), a carbide (e.g., SiC, WC, etc.), and/or a metal oxide (e.g., TiO, TaO, etc.). The exemplary hard mask 312 has a substantially uniform thickness 314 selected to be between about 100 Angstroms and about 500 Angstroms.

Figure 4:
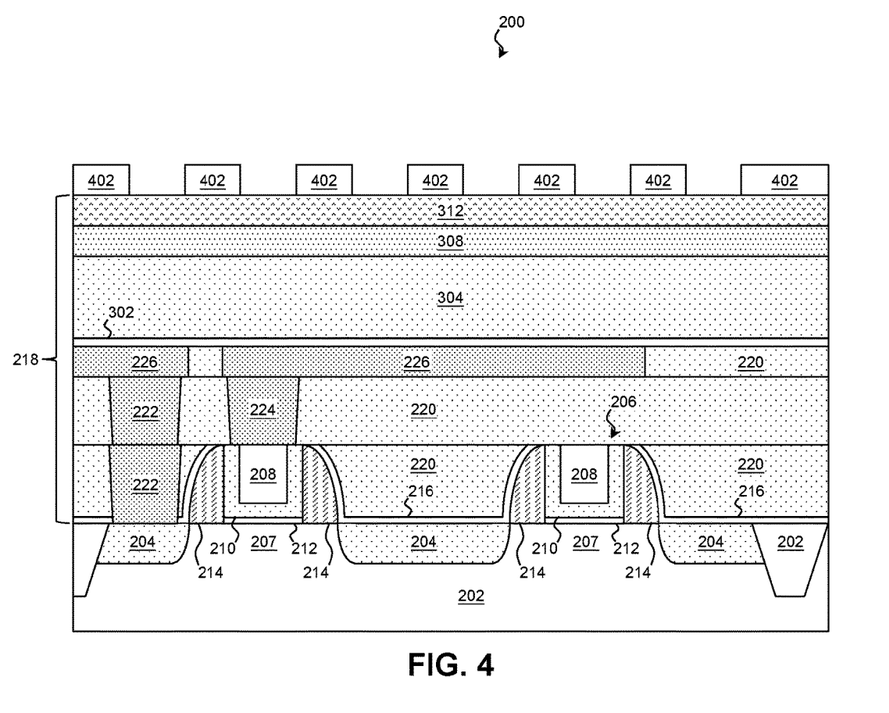

Referring to block 112 of FIG. 1A and to FIG. 4, a photoresist 402 is formed on the hard mask 312 and is patterned to define trenches for conductive lines. An exemplary photoresist 402 includes a photosensitive material that causes the layer to undergo a property change when exposed to light. This property change can be used to selectively remove exposed or unexposed portions of the photoresist in a process referred to as lithographic patterning. In one such embodiment, a photolithographic system exposes the photoresist 402 to radiation in a particular pattern determined by a mask. Light passing through or reflecting off the mask strikes the photoresist 402 thereby transferring a pattern formed on the mask to the photoresist 402. In other such examples, the photoresist 402 is patterned using a direct write or maskless lithographic technique, such as laser patterning, e-beam patterning, and/or ion-beam patterning. Once exposed, the photoresist 402 is developed leaving the exposed portions of the resist, or in alternative examples, leaving the unexposed portions of the resist. An exemplary patterning process includes soft baking of the photoresist 402, mask aligning, exposure, post-exposure baking, developing the photoresist 402, rinsing, and drying (e.g., hard baking). The patterned photoresist 402 exposes portions of the hard mask 312 to be etched.

Figure 5:
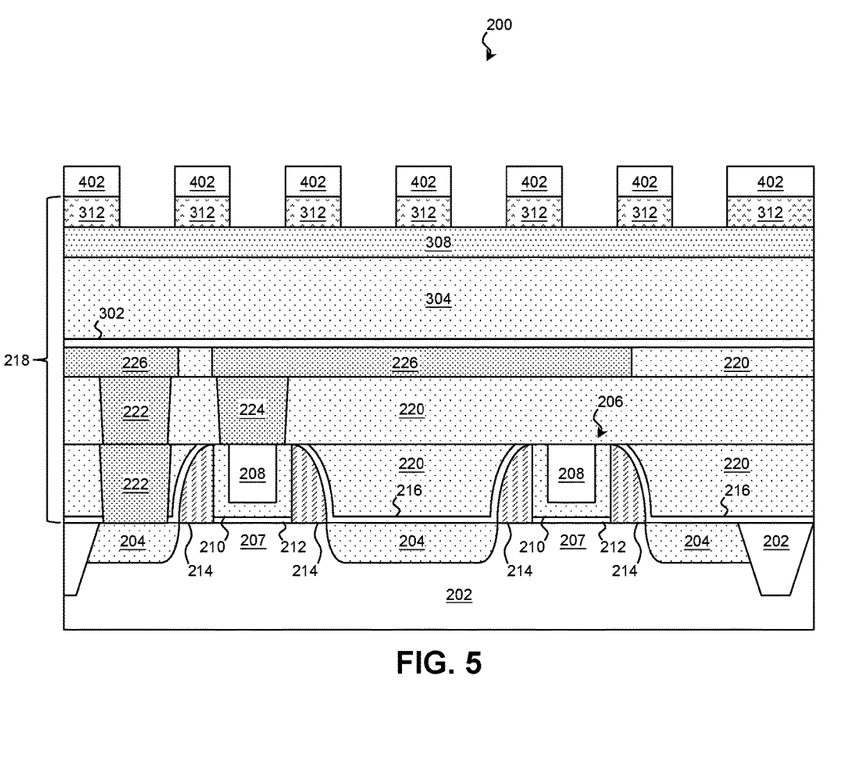

Referring to block 114 of FIG. 1A and to FIG. 5, the exposed portions of the hard mask 312 are etched to open the hard mask 312 and expose the second ILD layer 308. The etching process may include an anisotropic (directional) etching configured to etch vertically through the hard mask 312 without substantial horizontal etching. Accordingly, the etching processes may include any suitable etching technique, such as dry etching, wet etching, Reactive Ion Etching (RIE), ashing, and/or other etching methods. The etching process may use any suitable etchant, and the particular etchant or etchants may depend on the materials of the hard mask 312 being used. For example, an etchant may be selected to etch the hard mask 312 without substantial etching of the second ILD layer 308. The remaining photoresist 402 may be removed after etching the hard mask 312.

Figure 6:
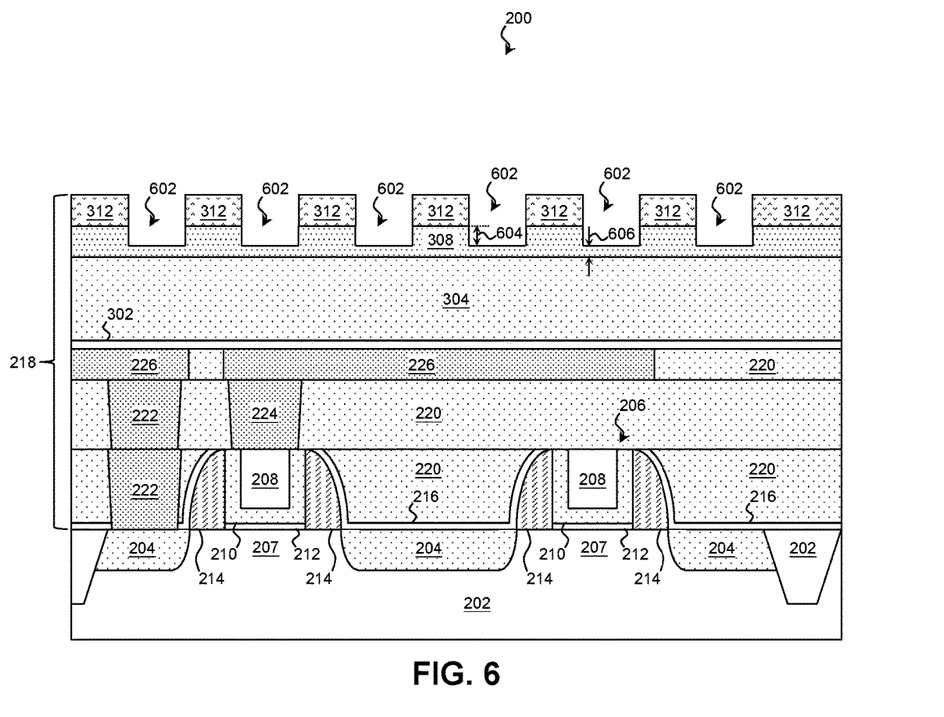

Referring to block 116 of FIG. 1A and to FIG. 6, a trench etch is performed on the second ILD layer 308. The trench etch forms line trenches 602 within those portions of the second ILD layer 308 exposed by the hard mask 312. The line trenches 602 may extend partially or completely through the second ILD layer 308. In some examples, the trench etch etches part way through the second ILD layer to form line trenches 602 that extend between about 10 Angstroms and about 75 Angstroms into the second ILD layer 308 as indicated by marker 604. This leaves between about 10 Angstroms and about 75 Angstroms of the second ILD layer 308 between the line trench 602 and the first ILD layer 304 as indicated by marker 606. Put another way, the trench etch etches between about 10% and about 50% of the thickness of the second ILD layer 308.

The etching process of the trench etch may include an anisotropic (directional) etching configured to etch vertically through the second ILD layer 308 without substantial horizontal etching to produce a center-to-edge depth bias of less than 20 Angstroms. Accordingly, the etching processes may include any suitable etching technique, such as dry etching, wet etching, Reactive Ion Etching (RIE), ashing, and/or other etching methods. The etching process may use any suitable etchant, and the particular etchant or etchants may depend on the materials of the second ILD layer 308 being etched. For example, an etchant may be selected to etch the second ILD layer 308 without substantial etching of the hard mask 312. In some examples, the etching includes a microwave plasma etching process using an RF power between about 200 W and about 1000 W and/or a MHz plasma etching process using an RF power between about 200 W and about 500 W. In some such examples, etching is performed at a pressure between about 20 mT and about 80 mT and at a temperature of between about 0° C. and about 50° C. The etchant may include a fluorine-based etchant, such as $C_xF_y$, supplied at between about 20 sccm and about 50 sccm and may include ambient gasses such as: $N_2$ supplied at above 0 sccm and below about 100 sccm; $O_2$ supplied at above 0 sccm and below about 25 sccm; and/or Ar supplied at between about 600 sccm and about 1200 sccm. In some such examples, a DC self-bias voltage between about 0V and about −500V is applied to the workpiece 200.

Figure 7:
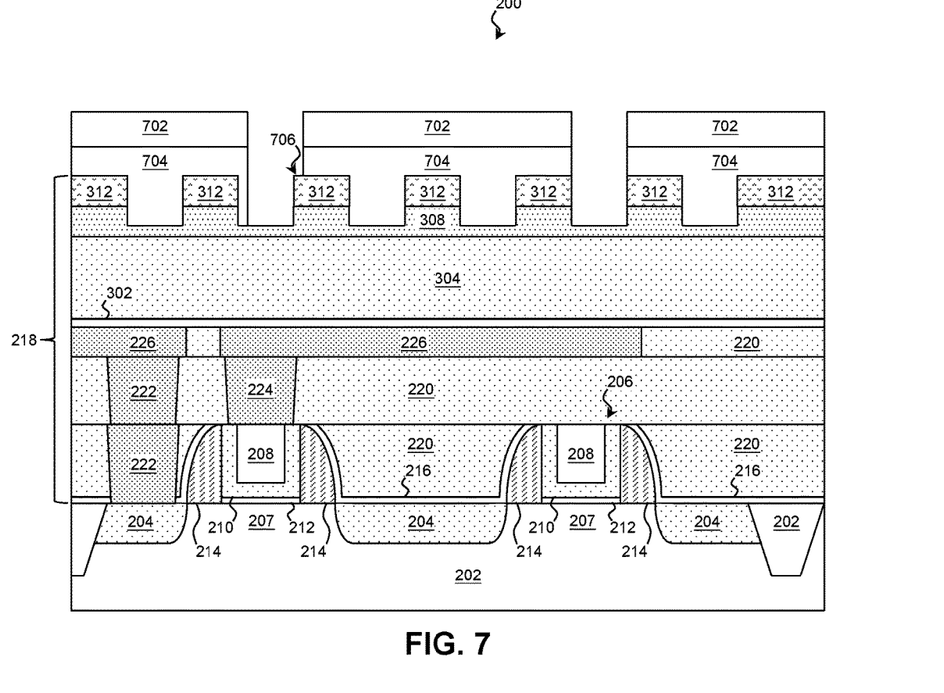

Referring to block 118 of FIG. 1B and to FIG. 7, a second photoresist 702 is formed on the hard mask 312. To provide a planar surface for the second photoresist 702, a leveling material 704, such as a BARC (Bottom Anti-Reflective Coating) material, a dielectric material, and/or other suitable material, is formed on the second ILD layer 308 and within the line trenches 602. In such examples, the second photoresist 702 is formed on the leveling material 704.

The second photoresist 702 is patterned to define trenches for vias that extend between conductive lines. Forming and patterning the second photoresist 702 may be performed substantially as described in block 112. An exemplary patterning process includes soft baking of the second photoresist 702, mask aligning, exposure, post-exposure baking, developing the second photoresist 702, rinsing, and drying (e.g., hard baking). The patterning of the second photoresist 702 may include pattern the leveling material 704 by removing exposed portions of the leveling material 704. It is noted that aspects of the patterning process, such as overlay error during photolithography, may cause the pattern of the second photoresist 702 to be shifted relative to the line trenches 602. This may expose the upper surface of the hard mask 312 as indicated by marker 706.

Figure 8A:
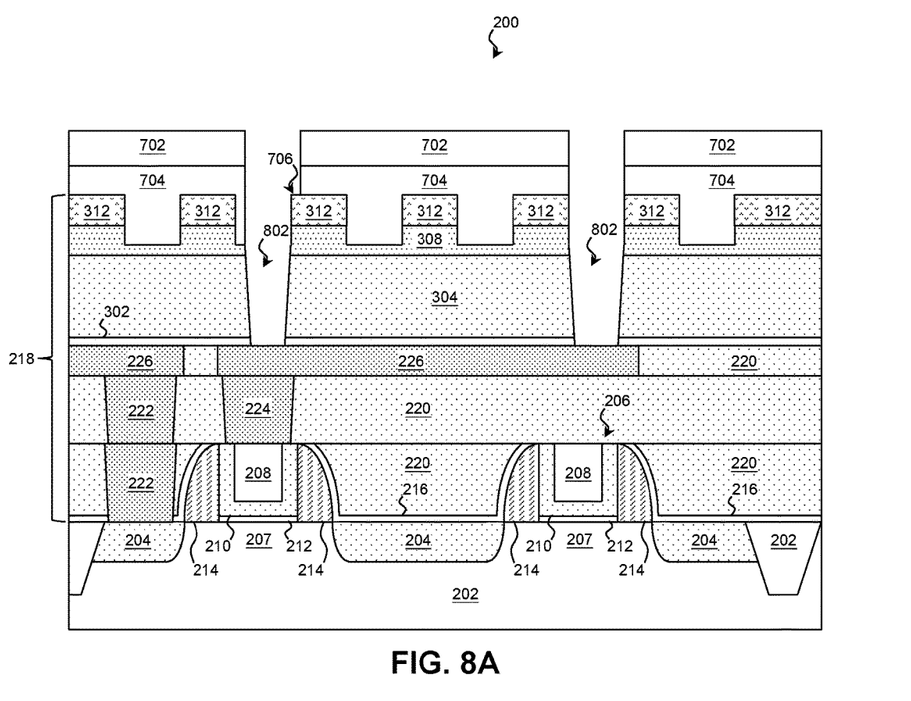

Referring to block 120 of FIG. 1B and to FIG. 8A, a via etch is performed on the first ILD layer 304, and, in some examples, the second ILD layer 308. The via etch forms via recesses 802 within those portions of the first ILD layer 304 and/or second ILD layer 308 exposed by the second photoresist 702 and the hard mask 312. The via recesses 802 may extend completely through the first ILD layer 304 and the etch stop 302 underneath.

The etching process of the trench etch may include an anisotropic (directional) etching configured to etch vertically through the first ILD layer 304 and/or second ILD layer 308 without substantial horizontal etching to produce a center-to-edge depth bias of less than 20 Angstroms. Accordingly, the etching processes may include any suitable etching technique, such as dry etching, wet etching, Reactive Ion Etching (RIE), ashing, and/or other etching methods. The etching process may use any suitable etchant, and the particular etchant or etchants may depend on the materials of the first ILD layer 304, the second ILD layer 308, and the etch stop 302 being etched. As noted, above, aspects of patterning the second photoresist 702, such as overlay error, may expose the upper surface of the hard mask 312. Accordingly, an etchant may be selected to etch the first ILD layer 304, the second ILD layer 308, and the etch stop 302 without substantial etching of the hard mask 312.

To further reduce unintended etching of the hard mask 312, the etchant and/or the ambient atmosphere may be configured to passivate the hard mask 312 to better resist the etchant. For example, hydrogen may be used to passivate a TiN-containing hard mask 312. It is believed that the hydrogen reacts with the exposed TiN to create a compound more resistant to certain etchant species than TiN alone. However, it is understood that the present disclosure is not limited to this particular passivation mechanism. In some examples, including a passivation agent causes the via etch process to be notably different from the trench etch process, which may lack the passivation agent. It has been determined that performing the via etch without the passivation agent may result in etching of the exposed hard mask 312 and the underlying ILD layers 304 and 308. As a result, a via formed in such a recess may be close enough to short to an adjacent conductive line or develop a leakage current through the adjacent line even when the via and the line do not physically contact. The passivation agent may reduce or eliminate such conditions.

In some examples, the via etch includes a microwave plasma etching process using an RF power between about 200 W and about 1000 W and/or a MHz plasma etching process using an RF power between about 200 W and about 500 W. In some such examples, etching is performed at a pressure between about 20 mT and about 80 mT and at a temperature of between about 0° C. and about 50° C. In some such examples, the etchant may include a fluorine-based etchant, such as $C_xF_y$, supplied at between about 20 sccm and about 50 sccm and may include a passivating gas, such as $H_2$ supplied at above 0 sccm and below about 100 sccm, and ambient gasses such as: $N_2$ supplied at above 0 sccm and below about 100 sccm; $O_2$ supplied at above 0 sccm and below about 25 sccm; and/or Ar supplied at between about 600 sccm and about 1200 sccm. In some such examples, the process uses an etchant that includes the passivation agent, such as $CH_xF_y$, supplied at above 0 sccm and 100 sccm either instead of or in addition to the above-noted etchant and may utilize ambient gasses such: as $N_2$ supplied at above 0 sccm and below about 100 sccm; $O_2$ supplied at above 0 sccm and below about 25 sccm; and/or Ar supplied at between about 600 sccm and about 1200 sccm. In some such examples, a DC self-bias voltage between about 0V and about −500V is applied to the workpiece 200.

In an example, the passivating agent may be supplied during a first interval of the via etch without being supplied during a second interval. For example, where the via etch process etches an etch stop layer 302 that contains a material in common with the hard mask 312, the passivating agent may be supplied until the etch stop layer 302 is exposed and then the supply of the passivating agent may be stopped to facilitate etching of the etch stop layer 302. Any remaining portions of the second photoresist 702 and the leveling material 704 may be removed following the via etch as shown in FIG. 8B.

Figure 8B:
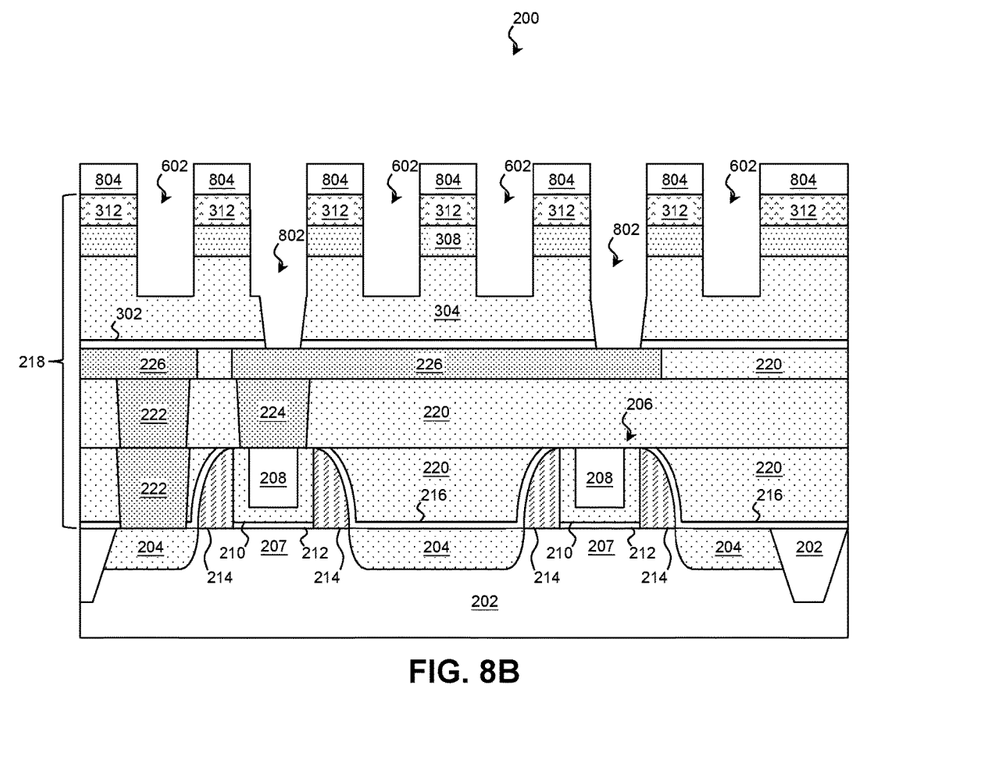

Referring to block 122 of FIG. 1B and to FIG. 8B, in some examples, a line etch may be performed to further extend the line trenches 602 after removing the second photoresist 702 and the leveling material 704. This may be done without using a photomask by anisotropically etching the first ILD layer 304 and the second ILD layer 308 using an etchant selected to avoid significant etching of the hard mask 312. Additionally or in the alternative, a third photoresist 804 may be formed on the workpiece 200. The third photoresist 804 is patterned to expose the second ILD layer 308 within the line trenches 602 and the first and second ILD layers 304 and 308 within the via recesses 802. Forming and patterning the third photoresist 804 may be performed substantially as described in block 112. As with the second photoresist 702, aspects of the patterning process for the third photoresist 804 may cause the pattern of the second photoresist 702 to be shifted relative to the line trenches 602 and via recesses. This may expose the upper surface of the hard mask 312.

In examples with and without the third photoresist 804, the line etch is performed to remove material of the first ILD layer 304 and the second ILD layer 308 without substantial etching of the hard mask 312. The line etch extends the line trenches 602 such that they extend into, but not through, the first ILD layer 304. The line etch may also extend the portions of the via recesses 802 that will eventually form conductive lines. The etching process of the trench etch may include any suitable anisotropic etching configured to etch vertically through the first ILD layer 304 and/or second ILD layer 308 without substantial horizontal etching and without substantial etching of the hard mask 312, such as dry etching, wet etching, Reactive Ion Etching (RIE), ashing, and/or other etching methods. The etching process may use any suitable etchant, and the particular etchant or etchants may depend on the materials of the first ILD layer 304, the second ILD layer 308, and the hard mask 312 being used. If a third photoresist 804 is used, any remaining portions of the third photoresist 804 may be removed following the line etch.

Figure 9:
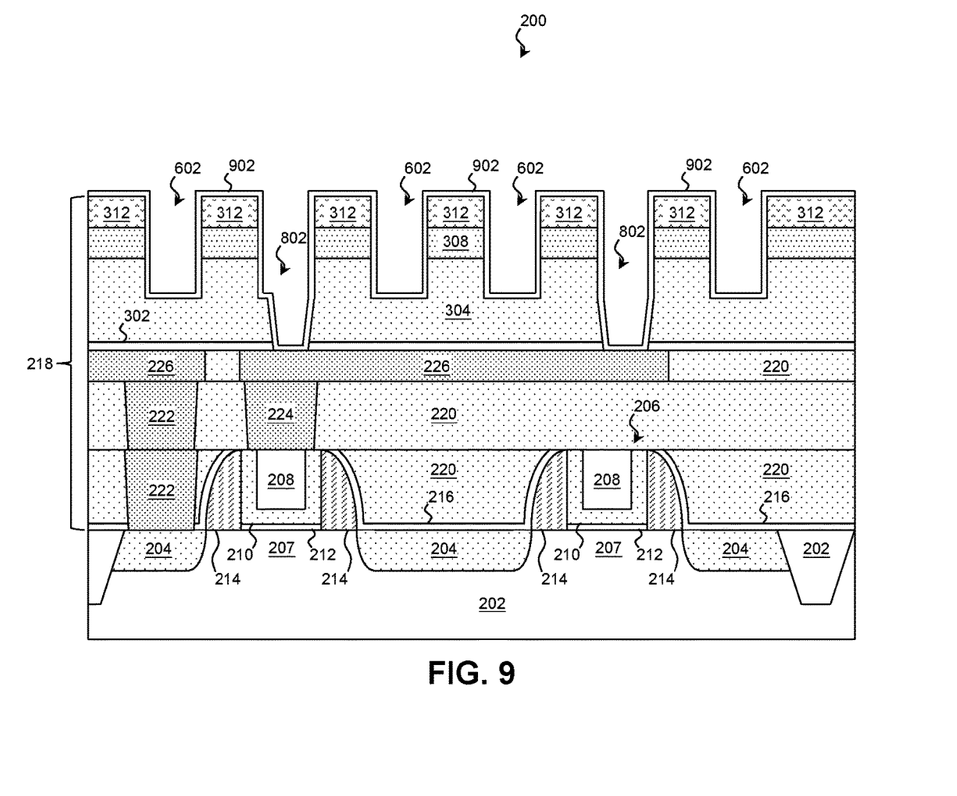

Referring to block 124 of FIG. 1B and to FIG. 9, a glue layer 902 is formed in the line trenches 602 and the via recesses 802. The glue layer 902 may extend along the sidewalls and the bottom surfaces of the line trenches 602 and the via recesses 802. In particular, the glue layer 902 may extend along the side surfaces of the hard mask 312, the second ILD layer 308, the first ILD layer 304, and/or the etch stop 302 and may extend along the horizontal surfaces of the first ILD layer 304 in the line trenches 602 and those of the features in the lower level of the interconnect structure 218 (e.g., conductive lines 226). The glue layer 902 may improve the formation of the conductive lines and the vias by enhancing wettability, increasing adhesion, and/or preventing diffusion. The glue layer 902 may include a metal, a metal nitride, a metal oxide, other suitable conductive material, and/or other suitable glue material. The glue layer 902 may be formed by any suitable process including ALD, CVD, LPCVD, PECVD, PVD, and/or other suitable techniques. In some examples, the glue layer 902 includes Ti or TiN formed by ALD using tetrakis-dimethylamino titanium (TDMAT) as a titanium-containing precursor. In some examples, the glue layer 902 includes Ti or TiN formed by ALD using titanium tetrachloride as a titanium-containing precursor. The glue layer 902 produced by these processes and others may be formed to any suitable thickness and, in some examples, has a substantially uniform thickness selected to be between about 10 Angstroms and about 100 Angstroms.

Figure 10:
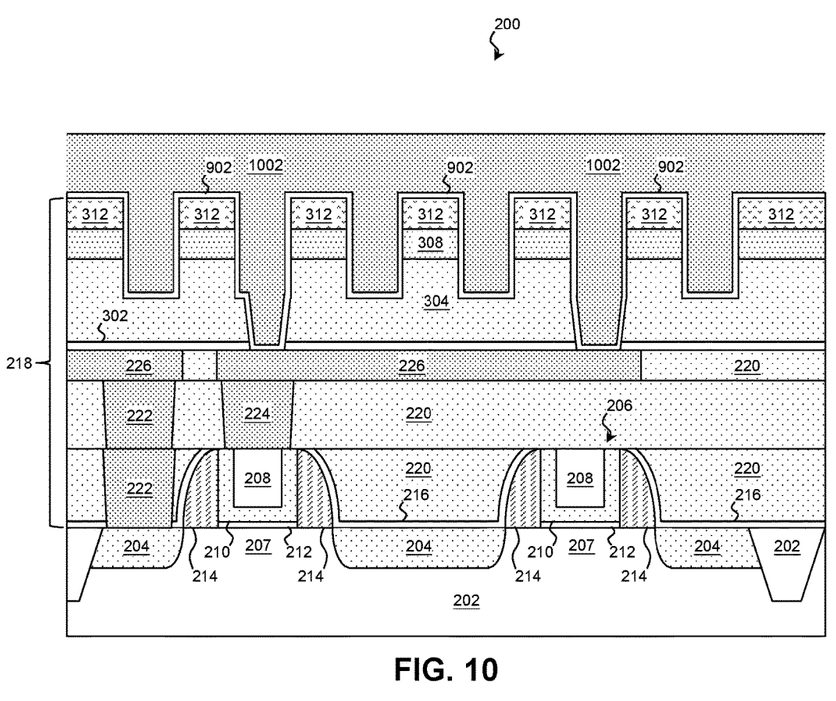

Referring to block 126 of FIG. 1B and to FIG. 10, a fill material 1002 is formed on the glue layer 902 in the line trenches 602 and the via recesses 802. The fill material 1002 may include a metal, a metal nitride, a metal oxide, and/or other suitable conductive material. In various examples, the fill material 1002 includes copper, cobalt, tungsten, and/or combinations thereof. The fill material 1002 may be formed by any suitable process including CVD, LPCVD, PECVD, PVD, ALD, and/or other suitable techniques. In an example, the fill material 1002 is deposited by alternating PVD and CVD cycles.

Referring to block 128 of FIG. 1B, a thermal reflow process may be performed on the workpiece 200. The thermal reflow process may include a thermal annealing to eliminate voids or striations within the line trenches 602 and via recesses 802. The thermal reflow process may include heating the workpiece 200 to any suitable temperature and, in various examples, includes heating the workpiece 200 to a temperature between about 300° C. and about 500° C.

Figure 11:
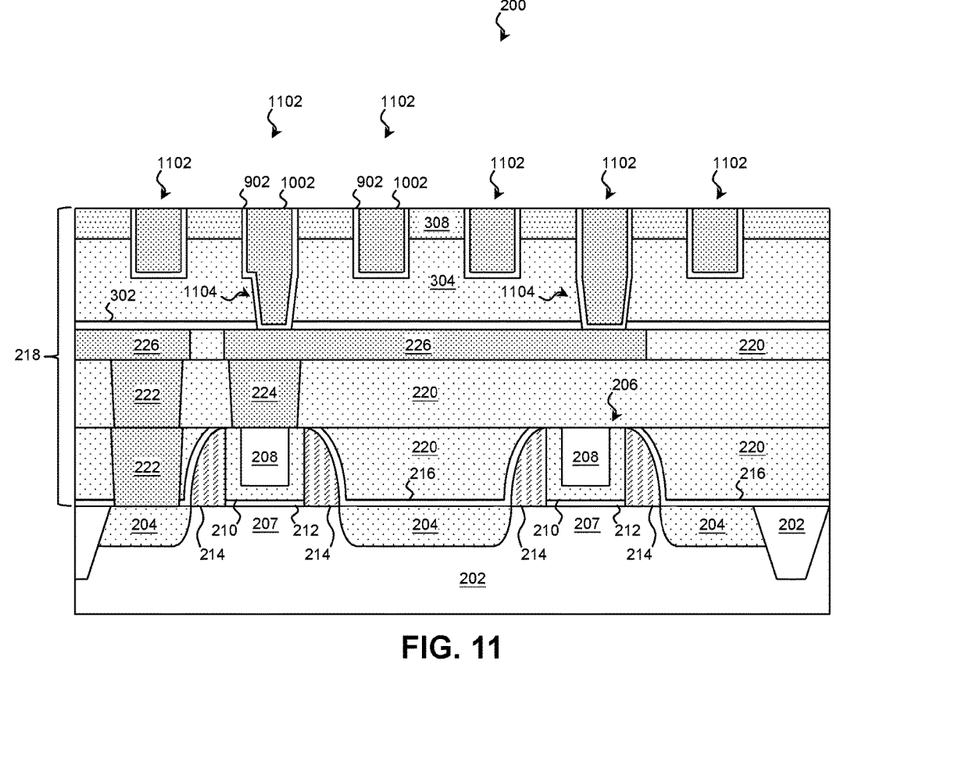

Referring to block 130 of FIG. 1B and to FIG. 11, a Chemical Mechanical Polishing/Planarization (CMP) process is performed on the workpiece 200. The CMP process may remove excess fill material 1002 and glue layer 902 material and may remove the hard mask 312 as well. In so doing, the CMP process may remove separate the remaining fill material 1002 and glue layer 902 to form electrically discrete conductive lines 1102 and vias 1104 that electrically couple the conductive lines 1102 to features in the lower level of the interconnect structure 218 (e.g., conductive lines 226).

Referring to block 132 of FIG. 1B, the workpiece 200 may be provided for further fabrication such as forming additional layers of the interconnect structure 218.

Thus, the present disclosure provides examples of fabricating an integrated circuit device utilizing a passivation agent during etching to form an interconnect structure. In some examples, an integrated circuit workpiece is received that includes a conductive interconnect feature. A first Inter-Level Dielectric (ILD) layer is formed on the conductive interconnect feature, and a second ILD layer is formed on the first ILD layer. A hard mask is formed on the second ILD layer. A via recess is etched extending through the first ILD layer, the second ILD layer and the hard mask to expose the conductive interconnect feature. The etching includes providing a passivation agent that reacts with a material of the hard mask to reduce etchant sensitivity. In some such examples, the hard mask includes TiN, and the passivation agent includes hydrogen based on the hard mask including TiN. In some such examples, the passivation agent includes $H_2$. In some such examples, the hydrogen is supplied as a hydrogen-containing etchant. In some such examples, the etching of the via recess exposes a top surface of the hard mask to an etchant, and the passivation agent reacts with the top surface of the hard mask to reduce etchant sensitivity to the etchant. In some such examples, a conductive material is deposited in the via recess to form a via electrically coupled to the conductive interconnect feature. In some such examples, a line trench is etched in the second ILD layer prior to the etching of the via recess. In some such examples, the etching of the line trench ceases when the line trench extends part way through the second ILD layer. In some such examples, the etching of the line trench is performed without supplying the passivation agent. In some such examples, a conductive material is concurrently deposited in the via recess and in the line trench, and a chemical mechanical polishing process is performed to separate a first portion of the conductive material in the via recess and a second portion of the conductive material in the line trench.

In further examples, a method includes receiving a substrate having a conductive feature disposed thereupon. A first Inter-Level Dielectric (ILD) layer is formed on the conductive feature, a second ILD layer is formed on the first ILD layer, and a hard mask is formed on the second ILD layer. A trench etch is performed to form a trench extending through the hard mask and extending at least partially through the second ILD layer. A via etch is performed to form a via recess aligned with the trench that extends through the first ILD layer. The performing of the via etch includes supplying a passivation agent configured to passivate the hard mask. In some examples, the passivation agent includes hydrogen. In some examples, the hydrogen is supplied as $H_2$. In some examples, the hydrogen is supplied as a hydrogen-containing etchant. In some examples, the performing of the via etch exposes a surface of the hard mask that is opposite the substrate to an etchant, and the passivation agent is configured to increase a resistance of the surface of the hard mask to the etchant.

In yet further examples, a method includes receiving an integrated circuit workpiece that includes: an interconnect feature, an Inter-Level Dielectric (ILD) layer disposed on the interconnect feature, and a hard mask disposed on the ILD layer. The hard mask and the ILD layer are patterned to form a recess that exposes the interconnect feature. The patterning includes supplying hydrogen and an etchant, and a material of the hard mask is selected such that the hydrogen reacts with the material to increase a resistance to the etchant. A via is formed in the recess that is electrically coupled to the interconnect feature. In some such examples, the hydrogen is supplied as $H_2$. In some such examples, the hydrogen is supplied as a hydrogen-containing etchant. In some such examples, the ILD layer is a first ILD layer, and the integrated circuit workpiece further includes a second ILD layer disposed between the first ILD layer and the hard mask. The patterning of the hard mask and the first ILD layer includes patterning the hard mask and the second ILD layer to form a trench extending at least partially through the second ILD layer. In some such examples, the forming of the via in the recess includes concurrently forming a conductive material in the recess and in the trench, and performing a chemical mechanical polishing process to separate a first portion of the conductive material in the recess from a second portion of the conductive material in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
 receiving an integrated circuit workpiece that includes a conductive interconnect feature;
 forming a first Inter-Level Dielectric (ILD) layer on the conductive interconnect feature;
 forming a second ILD layer on the first ILD layer;
 forming a hard mask on the second ILD layer; and
 etching a via recess extending through the first ILD layer, the second ILD layer and the hard mask to expose the conductive interconnect feature, wherein the etching includes providing a passivation agent that reacts with a material of the hard mask to reduce etchant sensitivity.

2. The method of claim 1, wherein the hard mask includes TiN, and wherein the passivation agent includes hydrogen.

3. The method of claim 2, wherein the passivation agent includes $H_2$.

4. The method of claim 2, wherein the hydrogen is supplied as a hydrogen-containing etchant.

5. The method of claim 1, wherein:
 the etching of the via recess exposes a top surface of the hard mask to an etchant, and
 the passivation agent reacts with the top surface of the hard mask to reduce etchant sensitivity to the etchant.

6. The method of claim 1 further comprising depositing a conductive material in the via recess to form a via electrically coupled to the conductive interconnect feature.

7. The method of claim 1 further comprising:
 etching a line trench in the second ILD layer prior to the etching of the via recess.

8. The method of claim 7, wherein the etching of the line trench ceases when the line trench extends part way through the second ILD layer.

9. The method of claim 7, wherein the etching of the line trench is performed without supplying the passivation agent.

10. The method of claim 7 further comprising:
 concurrently depositing a conductive material in the via recess and in the line trench; and
 performing a chemical mechanical polishing process to separate a first portion of the conductive material in the via recess and a second portion of the conductive material in the line trench.

11. A method comprising:
 receiving a substrate having a conductive feature disposed thereupon;
 forming a first Inter-Level Dielectric (ILD) layer on the conductive feature, a second ILD layer on the first ILD layer, and a hard mask on the second ILD layer;
 performing a trench etch to form a trench extending through the hard mask and extending at least partially through the second ILD layer; and
 performing a via etch to form a via recess aligned with the trench that extends through the first ILD layer, wherein the performing of the via etch includes supplying a passivation agent configured to passivate the hard mask.

12. The method of claim 11, wherein the passivation agent includes hydrogen.

13. The method of claim 12, wherein the hydrogen is supplied as $H_2$.

14. The method of claim 12, wherein the hydrogen is supplied as a hydrogen-containing etchant.

15. The method of claim 11, wherein the performing of the via etch exposes a surface of the hard mask that is opposite the substrate to an etchant, and wherein the passivation agent is configured to increase a resistance of the surface of the hard mask to the etchant.

16. A method comprising:
 receiving an integrated circuit workpiece that includes:
   an interconnect feature;
   an Inter-Level Dielectric (ILD) layer disposed on the interconnect feature; and
   a hard mask disposed on the ILD layer;
 patterning the hard mask and the ILD layer to form a recess that exposes the interconnect feature, wherein:
   the patterning includes supplying hydrogen and an etchant, and
   a material of the hard mask is selected such that the hydrogen reacts with the material to increase a resistance to the etchant; and
 forming a via in the recess that is electrically coupled to the interconnect feature.

17. The method of claim 16, wherein the hydrogen is supplied as $H_2$.

18. The method of claim 16, wherein the hydrogen is supplied during a first interval of the patterning of the hard mask and the ILD layer to form the recess without being supplied during a second interval of the patterning of the hard mask and the ILD layer to form the recess.

19. The method of claim 16, wherein:
the ILD layer is a first ILD layer;
the integrated circuit workpiece further includes a second ILD layer disposed between the first ILD layer and the hard mask; and
the patterning of the hard mask and the first ILD layer includes patterning the hard mask and the second ILD layer to form a trench extending at least partially through the second ILD layer.

20. The method of claim 19, wherein the forming of the via in the recess includes:
concurrently forming a conductive material in the recess and in the trench; and
performing a chemical mechanical polishing process to separate a first portion of the conductive material in the recess from a second portion of the conductive material in the trench.

* * * * *